United States Patent [19]

Adams et al.

[11] Patent Number: 5,045,435

[45] Date of Patent: Sep. 3, 1991

[54] WATER-BORNE, ALKALI-DEVELOPABLE, PHOTORESIST COATING COMPOSITIONS AND THEIR PREPARATION

[75] Inventors: Diane L. Adams, Lancaster; Wendell A. Ehrhart, Red Lion; Donald Jones, Leola, all of Pa.

[73] Assignee: Armstrong World Industries, Inc., Lancaster, Pa.

[21] Appl. No.: 491,978

[22] Filed: Mar. 12, 1990

Related U.S. Application Data

[63] Continuation-in-part of Ser. No. 275,901, Nov. 25, 1988, abandoned.

[51] Int. Cl.$^5$ .................... G03C 1/73; G03F 7/33
[52] U.S. Cl. .................... 430/288; 430/325; 522/39; 522/42; 522/44; 522/46; 522/53; 522/63; 524/533; 524/534
[58] Field of Search ........... 430/288, 910, 325, 286; 524/533, 534; 522/46, 39, 63, 44, 42, 53

[56] References Cited

U.S. PATENT DOCUMENTS

| | | | |
|---|---|---|---|
| 2,760,863 | 8/1956 | Plambeck | 430/271 |
| 4,064,087 | 12/1977 | Das | 260/29.6 |
| 4,151,143 | 4/1979 | Blank et al. | 524/533 |
| 4,186,069 | 1/1980 | Muzyczko et al. | 430/175 |
| 4,228,232 | 10/1980 | Rousseau | 430/271 |
| 4,289,844 | 9/1981 | Specht et al. | 430/288 |
| 4,414,354 | 11/1983 | Slocombe | 522/39 |
| 4,542,088 | 9/1985 | Kojima et al. | 430/288 |
| 4,590,146 | 5/1986 | Wallbillich | 430/281 |
| 4,671,854 | 6/1987 | Ishikawa et al. | 156/659.1 |
| 4,705,740 | 11/1987 | Geissler et al. | 430/288 |
| 4,710,446 | 12/1987 | Hoffmann et al. | 430/281 |
| 4,725,524 | 2/1988 | Elzer et al. | 430/258 |
| 4,789,620 | 12/1988 | Sasaki et al. | 430/280 |
| 4,842,987 | 6/1989 | Elzer et al. | 430/281 |
| 4,877,715 | 10/1989 | Koch et al. | 430/288 |
| 4,950,580 | 8/1990 | Hilger | 430/281 |

Primary Examiner—Marion E. McCamish
Assistant Examiner—Christopher D. RoDee

[57] ABSTRACT

An aqueous photopolymer composition is produced by adding a monomer to a latex of a partially neutralized carboxylated acrylic copolymer, having an acid number greater than 80, along with photoinitiator and components to produce an aqueous coatable and alkali developable photoresist composition. Preferred neutralization is 30–50% for dip-coating and 40–60% for screen-printing to produce 1 mil lines and 1 mil space after ultraviolet exposure and mild alkali development.

24 Claims, No Drawings

WATER-BORNE, ALKALI-DEVELOPABLE, PHOTORESIST COATING COMPOSITIONS AND THEIR PREPARATION

CROSS-REFERENCE TO RELATED APPLICATION

This application is a continuation-in-part of U.S. Ser. No. 275,901, filed Nov. 25, 1988, entitled "Aqueous Photoresist," now abandoned.

FIELD OF THE INVENTION

The invention relates to photopolymerizable compositions and their preparation. More particularly, the invention relates to liquid photopolymer compositions which employ aqueous solutions for both application and development.

Photopolymerizable compositions useful as photoresists, printing plates, solder masks, etc. have been of commercial interest for over 20 years. While the original photopolymerizable compositions were applied and developed using organic solvents, the present day emphasis has been to avoid the use of organic solvents as much as possible and instead for environmental reasons, to depend increasingly on water. This is clear from U.S. Pat. Nos. 4,100,047, 4,564,580 and 4,133,909 which describe aqueous coatings; and from U.S. Pat. Nos. 3,953,309 and 4,361,640 which teach compositions that can be developed with aqueous solutions. Another aqueous processable photopolymerizable composition is described in U.S. Pat. No. 4,510,230, disclosing organic acids employed within an acid binder photopolymer composition to decrease scum or stain on a copper surface. It was also known to employ amines or ammonia in preparing and formulating photopolymer compositions, i.e. U.S. Pat. Nos. 2,893,868; 4,298,879; 4,495,271; and European Patent Application No. 86 104 781.9.

Yet in spite of the considerable volume of art and commercially available products and processes, a need still remained for a process and product which could meet the requirements for a waterborne, liquid applied, contact imageable photoresist which satisfied fine resolution requirements for printed circuit and wiring board manufacture.

SUMMARY OF THE INVENTION

The coating composition provided is both waterborne, and aqueous alkali developable, thus completely avoiding organic solvents. These coating mixtures are storage stable, homogeneous compositions that form uniform, homogeneous photoresist layer films that develop readily in aqueous alkali, but are resistant to other solutions like etch and plating baths. The instant photoresist coating composition comprises (a) a multifunctional acrylate monomer, (b) a photoinitiator, and (c) a latex of a water insoluble carboxylated (meth)acrylate copolymer having an acid number greater than 80, the latex having been neutralized with a base in an amount in excess of 0.25 equivalents of base per equivalent of acid. If a contact imageable resist layer is desired, then the latex used will have a glass transition temperature high enough to make sure that the resist film formed is not tacky (the Tg is high enough to be effective to form a non-tacky resist coat).

The present invention also provides a water-borne and alkali developable photopolymer composition comprising an aqueous emulsion in parts by weight of:

(a) 40 to 90 parts water insoluble carboxylated acrylate copolymer latex with said copolymer having a glass transition temperature (Tg) greater than 60° C. and acid number greater than 80, (b) 5 to 40 parts multifunctional monomer, and (c) 1 to 15 parts photoinitiator.

In a preferred composition a latex of methylmethacrylate and acrylic or methacrylic acid copolymer having a Tg greater than 90° C. and acid number greater than 100 wherein 30 to 60% of the carboxylic groups are reacted with ammonia is used. This will be combined with at least one multifunctional acrylate monomer, and at least one photoinitiator.

Remarkably, under the present invention, both the monomer and the photoinitiator can be water immiscible, and yet, a storage stable, homogeneous coating composition will be formed.

A method for preparing an aqueous coatable and alkali developable photoresist composition comprises the steps:

(1) adding a base to a latex of a carboxylated acrylate or methacrylate copolymer; and
(2) adding monomer and photoinitiator to prepare an aqueous emulsion coating composition.

Resolution patterns are obtained by applying the instant coatable contact imageable composition to a metal substrate, drying the composition using heat to produce a film, imaging the photoresist film; and developing the photoresist film with mild aqueous alkali.

If the resist is contact imageable imaging will involve placing a pattern directly on the film and then exposing it to UV radiation.

The photoresist imaged substrate can be etched, or plated, and stripped to yield the desired circuit or wiring board or chemical milling product.

DETAILED DESCRIPTION OF THE INVENTION

It has been discovered that new and useful aqueous photopolymerizable compositions can be prepared from emulsified or surfactant dispersed lower alkyl methacrylate copolymers. In particular, a latex dispersion of a carboxylated copolymer is employed. Suitable copolymers prepared in latex form are of course aqueous, (waterborne) and are commercially available. The discovery that carboxylated copolymer latexes can be combined with monomer and photoinitiator to provide an aqueous coatable and aqueous carbonate developable photopolymer composition for contact imaging represents an advance over prior art techniques in which polymers or copolymers were prepared using organic solvents.

Advantageously, the instant invention provides a photoresist coating composition that is transmitted (carried) by water. The instant coating composition is thus waterborne, and no other solvent is used or needed. Furthermore, a remarkable combination is realized in this coating composition in that it provides a water-laid photoresist film that advantageously can be developed by an aqueous base.

It has been discovered that these new and useful aqueous photopolymerizable compositions can be stabilized by selectively neutralizing carboxylic acid groups of the instant copolymers. Not only is viscosity advantageously adjustable by adding base equivalents to the carboxylic acid groups, but neutralization surprisingly provides a much more storage stable composition, even when diluted with water.

It is even more surprising that water immiscible monomers and photoinitiators can be used and yet the composition is still homogeneous and even storage stable. It is also coatable to form a single phase layer upon drying.

Copolymers suitable for the practice of the invention have carboxylic acid groups, are substantially water insoluble in the unneutralized form, and have acid numbers greater than about 80. To obtain the highly desireable contact imageable (i.e. tack-free) formulations, Tg's (glass transition temperatures) of these copolymers must be above 60° C. as measured by Differential Scanning Calorimetry (DSC) @ 20°/min. Commercially available copolymers of this type can be obtained which will have a weight average molecular weight (Mw) 5,000–20,000 as measured by gel permeation chromatography, GPC, using a polystyrene standard.

The instant latex copolymers are typically prepared by the emulsion copolymerization of acrylic and/or methacrylic acids with other addition polymerizable monomers such as methacrylates, styrene, vinyl toluene, acrylates, etc. A typical emulsion polymerization procedure and some examples of suitable emulsions can be found in U.S. Pat. No. 3,929,743. Suitable emulsions can also be obtained commercially, such as: Neocryl ® CL-340 (40% solids) available from ICI Resins U.S. and Acrysol ® I-2074 (46% solids) available from Rohm and Haas. The emulsion may be used directly to prepare the aqueous, liquid applied, contact imageable photoresists of this invention. Then according to the stabilization practice of the present invention, addition of ammonia and/or other base causes an increase in solution viscosity and produces a binder for a stable and superior aqueous photoresist. Change in viscosity and improvement in emulsion stability is more or less insignificant with less than about 25% neutralization. At least about 25% neutralization is required.

While the specific mechanism is not known with certainty, it is believed that some additions of base equivalents to the carboxylated copolymer emulsion actually produce partial solutions instead of just dispersions. Thus, this "emulsification" to incorporate photoinitiator and monomer may produce a stable photopolymer coating composition which is really a combination of colloidal dispersion and true solution. In any event this "emulsion" can be diluted to a point where ordinary colloidal dispersions would separate.

While a binder having Tg greater than 60° C. and acid number greater than 80 provides superior results, it is possible to add other cobinders which differ in Tg, acid number, etc. Useful cobinders include: Neocryl ® BT-175, Neocryl ® BT-520, Neocryl ® BT-24 (ICI Americas Inc.), Eastman AQ 55D (Eastman Chemical Products, Inc.), and Scripset ® 740 and 808 (Monsanto Co.).

While it has been discovered that the best photopolymer compositions have been produced with water immiscible monomers, satisfactory photoresists have been produced with water soluble monomers where superior line spacing was not critical. Better adhesion of cured coating during developing is obtained with the preferred water immiscible multifunctional acrylate monomers. Without superior adhesion fine lines cannot be obtained.

While not considered to be exhaustive, suitable monomers include multifunctional acrylates ("acrylates" includes methacrylates), acrylate esters, n-vinyl pyrrolidones, and vinyl caprolactam. It should be understood that monofunctional monomers do not comprise the sole monomer; but would be used with a multifunctional monomer.

The monoacrylate monomers (having only one acrylate moiety) do not provide sufficient crosslinking density, to withstand the development solutions. Thus, due to substandard performance, a suitable photoresist is not obtained with the monoacrylate monomer alone. The polyacrylate monomer (with more than one acrylate moiety) is therefore required.

Preferred monomers are: lightly ethoxylated trimethylolpropane triacrylate, lightly propoxylated neopentyl glycol diacrylate, and lightly propoxylated glyceryl triacrylate. Lightly alkoxylated represents reacting about 2–7 moles of ethylene or propylene oxide with one mole of polyol.

Suitable photoinitiators include members selected from the group consisting of: Quantacure ® BMS from Biddle Sawyer Co. which is [4-(4-methylphenylthio)-phenyl] phenylmethanone, orthochloro HABI, P, P'-bis-dimethylamino benzophenone, benzophenone, 2,2-dimethoxy-2-phenylacetophenone, 1-hydroxycyclohexyl phenyl ketone, isopropylthioxanthone (mixture of 2- and 4-isomers) and z-methyl-1-[4-(methylthio) phenyl]-2-morpholinopropanone-1.

A preferred photoinitiator system is: 2-methyl-1-[4-(methylthio)phenyl]-2-morpholinopropanone-1 available as Irgacure ® 907 from Ciba-Geigy Corp. used in conjunction with isopropylthioxanthone (mixture of 2- and 4-isomers) available as Quantacure ® ITX from Biddle Sawyer Co.

Other additives permitted in other embodiments of the instant aqueous coating composition include organic dyes, pigments, defoamers, wetting agents, emulsifiers, surfactants, photoactivators, and photosensitizers. It can be seen from the examples that the instant compositions are coatable, and that they provide a homogeneous, smooth, single phased resist layer that is capable of providing excellent resolution. Thus, and realistically surfactant addition is not needed. Even a water immiscible photosensitizer can be added without calling for a surfactant. One could, however, include a surfactant if one is needed for a particular embodiment.

Suitable organic and inorganic bases include: ammonia, sodium hydroxide, potassium hydroxide, 4-methylmorpholine, 2-amino-2-methyl-1-propanol, 2-dimethylamino-2-methyl-1-propanol, monoethanol amine, N,N-dimethylethanolamine, methyldiethanol amine, and morpholine. The alkaline compound cyanamide which is a weak base, is not suitable since it does not thicken the emulsion or form a suitable dispersion.

The degree of neutralization can be used to advantage in preparing aqueous compositions for different methods of application. Thus when the aqueous photoresist is to be applied by screen-printing, it may be advantageous to use 0.4 to 0.6 equivalents of base in order to achieve the desired viscosity and rheology. Screen printers need compositions having higher viscosity and a different rheology than, for example, dip or spray coating because the screen must hold the liquid in the screen to draw the resist film layer. With the instant invention, the degree of neutralization can therefore be especially advantageous to obtain a screen-printable composition.

It can be difficult to increase the viscosity to a needed level, but the instant invention provides an easy way to increase by neutralization.

Alternatively, when the photoresist is to be dip coated, it may be preferred to use 0.3 to 0.5 equivalents of base and a percent solids preferably in the range of from about 30 to about 50, in order that the composition need not be overly dilute.

The percent solids concentration of the present coating compositions are preferred to at least about 25; preferably it is in the range of from about 30 to about 60% solids; the most preferred range being from 30 to 50% solids.

Neutralization is found to be the critical factor in getting the proper rheology and viscosity to the present coating compositions. Steps like the addition of thickening agents fail to deliver the needed, correct rheology, although a higher viscosity could be obtained. A key advantage of the instant case is the ability to have both the higher viscosity and also the rheology which is needed.

Another advantage with the instant compositions is the ability to develop with aqueous base. This allows a very easy cleaning of the waste water by acid neutralization. This is another key environmental benefit.

Ammonia is the preferred base. Not only is ammonia inexpensive and readily available, but ammonia is at least partially volatilized out of the photopolymer composition when it dries after being applied. Thus ammonia provides a benefit by stabilizing the coating composition, then volatilizing from the coating so as not to significantly interfere with subsequent processing steps.

An advantage of the preferred base treated composition is to provide a stable aqueous photoresist in which the monomer and photoinitiator are substantially permanently dispersed, i.e. generally no separation for at least six months. The photoresist has good adhesion to copper, aluminum, stainless steel and brass, both pumiced and unpumiced. The photoresist will perform as an etch resist, plating resist or solder mask when coated from 0.2 to 2.0 dry mil thickness.

The stabilization step of the invention involves the neutralization (preferably with an aqueous base solution) of a latex form of the carboxylated acrylic copolymer. Latexes comprising 30-50% solids by weight copolymer are commercially available or can be produced by emulsion polymerization. These aqueous latexes generally have a pH of 2.5 to 3.5 and a viscosity slightly higher than that of water. Generally, by adding up to about 1.0 equivalents of ammonia, viscosity increases from a slight thickening to almost a molasses consistency at a pH of about 6 to 7. In fact, more water can even be added to the coating compositions prepared from the 30-50 percent solids latexes. Even dilute compositions, furthermore, can be used to form resist layers by using suitable processing techniques such as making thicker coats to get a suitable layer after drying.

As ammonia is added to the acrylic copolymer emulsion, the viscosity will increase, with the change being dependent upon the specific emulsion and level of neutralization. The preferred range of neutralization is 0.3 to 0.6 eq. Below 0.3 eq., stability may be less than optimum, since it is approaching the lower limit at about 0.25 eq. Above 0.6 eq., the alkaline development of unexposed areas sometimes becomes more difficult, although the final product is quite satisfactory.

Once the desired degree of neutralization has been achieved, monomer, photoinitiator, surfactant, water, and other ingredients can be added to form the stable photoresist coating composition. Alternatively, all ingredients can be added together before the base is added since the base will still partially neutralize the acid and thicken and stabilize the composition.

Advantageously, a stable composition is provided which has the proper viscosity range to meet coating requirements. The coating application method can be dip coating, spraying, screen printing, etc. It is generally preferred to obtain a photoresist coating on metal of about 0.2 to 2 mil thickness after the water is removed by drying.

It is permissible to heat a little during drying to increase the drying speed. High temperatures, however, should be avoided because the high heat tends to drive off the monomer. In such a case the entire film may wash away in development; too high a temperature can also prevent coalescence of the latex into a solid film, nonuniformity and flakiness can result. The temperature used during drying therefore, will acceptably be less than 140° C., and preferably it is less than 120° C.

The dry photoresist layer can then be exposed through a phototool to produce photopolymerized areas that were exposed to ultraviolet light. Preferred photoresist formulations of the present invention can be dried to a tack-free state and are thus contact imageable, which is highly desireable. When treated with an aqueous alkaline solution such as 1% sodium or potassium carbonate, the unexposed (unpolymerized) areas are dissolved out, exposing the underlying metal. In particular, where the metal is copper, as is commonly used for printed circuits, it is possible to obtain 1 mil wide copper lines separated by 1 mil lines of photopolymerized photoresist.

A useful dip coating composition can comprise in parts by weight (per 100 parts):

| | |
|---|---|
| Carboxylated acrylic latex (30-50% solids) | 55-75 |
| Water | 25-30 |
| 28% aqueous ammonia | 1.0-3.6 |
| Acrylic or methacrylic monomer | 8-12 |
| Water insoluble photoinitiator | 1.5-3 |
| Photosensitizer | 0.2-0.8 |

A useful screen coating composition can comprise in parts by weight (per 100 parts:

| | |
|---|---|
| Carboxylated acrylic latex (30-50% solids) | 70-85 |
| Water | 5-10 |
| 28% aqueous ammonia | 1.4-4.0 |
| Acrylic or methacrylic monomer | 10-15 |
| Water insoluble photoinitiator | 1.5-3 |
| Photosensitizer | 0.2-0.8 |

It can be noted that the minimum ratio (by wt.) of polymer:monomer in the above, preferred coating compositions is about 58:42. If a contact imageable layer is desired, this ratio will not be much lower. Tackiness can be caused by too much monomer. Thus, for contact imageability, the ratio should be about 58:42 or greater; preferably it is higher, a more preferred minimum being 70:30. If, however, contact imageability is not important, then the ratio can be lower. There should be enough monomer (an effective amount) to be able to crosslink the resist film layer so that it cannot be washed away by the basic aqueous development solution. The polymer:monomer ratio therefore should not be greater than about 90:10.

Photopolymer compositions stabilized with organic or inorganic base can be prepared as follows:

In a preferred method photoinitiator(s) and photosensitizer(s) are dissolved in the monomer(s) to form a monomer pre-mix by heating the combination while mixing. Temperatures up to about 50° C. can be used. Mixing is done for a time effective to form the pre-mix (dissolve the ingredients). Usually about 20 minutes is sufficient. The solution is cooled to ambient temperature.

Meanwhile, the base (which may be diluted with some of the water) is gradually added to the latex while stirring. This mixture is stirred for about 30 minutes until it is uniform and thickened. The extent of thickening depends on the latex and the equivalents of base added.

The monomer pre-mix is then slowly added to the thickened latex. After about one hour mixing time, water, dye, and additives may be added to yield a photopolymer composition with the desired properties.

As is well known in the art, processing and fabrication steps can be undertaken after crosslinking and development. Such procedures could include, for example, electroplating, etching and stripping or removing, photoresist with strong alkali such as KOH. Thus, the present invention finds industrial applicability in the printed circuit and wiring board manufacturing industry such as use as an etch resist or plating resist. It can also be used for chemical milling.

The following preparations and examples, while not meant to be exhaustive, serve to illustrate the practice of the invention.

Preparation A

Dip-coatable/sprayable resist formulation

The following parts by weight of ingredients were combined in which the ammonia represented 0.48 equivalents of the acid groups of the acrylic latex. Monomer, photoinitiator and photosensitizer were combined at 120° F. prior to addition to the ammonia reacted acrylic latex.

| | |
|---|---|
| Acrylic latex Neocryl ® CL-340 (40% solids) (ICI Americas Inc.) Tg 94° C., acid number 145, [Mw 15,835] (GPC), a copolymer of methylmethacrylate, butyl acrylate and methacrylic acid | 59.4 |
| Deionized water | 25.9 |
| 28% aqueous ammonia | 1.8 |
| Lightly ethoxylated trimethylolpropane triacrylate monomononomer (Sartomer Co. SR-454) | 10.4 |
| Irgacure ® 907 photoinitiator (Ciba-Geigy) | 1.8 |
| Quantacure ® ITX photosensitizer (Biddle Sawyer) | 0.5 |
| Neolan Blue 2G dye (Ciba-Geigy) | 0.2 |
| | 100.0 |

Before addition of ammonia, the pH was 2.5. After ammonia addition, the pH was 6.5. The pH of the final coating was 6.6.

Preparation B

Screen-printable resist formulation

The following parts by weight ingredients were combined in which the ammonia represented 0.44 equivalents of the acid groups of the acrylic latex. Monomer, photoinitiator and photosensitizer were combined at 120° F. prior to addition to the ammonia reacted acrylic latex.

| | |
|---|---|
| Acrylic latex, Neocryl ® CL-340 (ICI Americas Inc.) [40% solids, Tg 94° C., acid number 145, [Mw 15,835] (GPC), a copolymer of methylmethacrylate, butyl acrylate and methacrylic acid] | 73.2 |
| Deionized water | 7.3 |
| 28% aqueous ammonia | 2.0 |
| Lightly ethoxylated trimethylolpropane triacrylate monomer (Sartomer Co. SR-454) | 12.8 |
| Irgacure ® 907 photoinitiator (Ciba-Geigy) | 2.2 |
| Quantacure ® ITX photosensitizer (Biddle Sawyer) | 0.6 |
| Phthalocyanine blue aqueous dispersion (Harshaw) | 0.6 |
| Foamaster NXZ defoamer (Diamond Shamrock Corp.) | 1.2 |
| Fluorad ® FC-431 wetting agent (3M Co.) | 0.1 |
| | 100.0 |

Before addition of ammonia, the pH was 2.5. After ammonia addition, the pH was 6.5. The pH of the final coating was 6.6.

Preparation C

Styrene Modified Copolymer Binder Dip Coating/Spray Formulation

The following parts by weight ingredients were combined in which the ammonia represented 0.48 equivalents of the acid groups of the acrylic latex. Monomer, photoinitiator, and photosensitizer were combined at 120° F. prior to addition to the ammonia reacted acrylic latex.

| | |
|---|---|
| Acrylic latex Acrysol ® I-2074 (Rohm & Haas Co.) a copolymer of methylmethacrylate, styrene, methacrylic acid, 46% solids, Tg 138° C., acid number 160, [Mw 5,660] (GPC) | 58.5 |
| Deionized water | 24.0 |
| 28% aqueous ammonia | 2.3 |
| Glyceryl propoxy triacrylate (Sartomer SR-9020) | 11.7 |
| Irgacure ® 907 photoinitiator | 2.0 |
| Quantacure ® ITX photosensitizer | 0.5 |
| Neolan Blue Dye | 0.3 |
| Fluorad ® FC-120 wetting agent | 0.7 |
| | 100.0 |

Before adding the ammonia, the latex had a pH of 3.5. After all additions were made to the resist formulation, the pH was 6.7.

Preparation D

Preparation B was repeated except that the ammonia was increased such that 1.0 equivalent of base was used. The formulation gave a final pH of 8 and was homogeneous.

Comparative Preparation E

Preparation A was repeated except that the ammonia was reduced such that only 0.2 equivalents were used. The formulation gave a final pH of 6.5 but was nonhomogeneous and could not be successfully dip coated on a substrate.

Comparative Preparation F

The following parts by weight ingredients were combined in which ammonia represented 0.4 equivalents of the acid groups of the acrylic latex.

| | |
|---|---|
| Acrylic latex Neocryl ® BT-175 (40% solids) Methylmethacrylate, butyl acrylate and acrylic/methacrylic acid - Acid No. 100, Tg 40° C. | 76.4 |
| Deionized water | 5.4 |
| 28% aqueous ammonia | 1.8 |

-continued

| | |
|---|---|
| Lightly ethoxylated trimethylolpropane triacrylate | 13.2 |
| Irgacure ® 907 photoinitiator | 2.3 |
| Quantacure ® ITX photosensitizer | 0.6 |
| Phthalocyanine Blue aqueous dispersion | 0.3 |
| | 100.0 |

Preparation G

A resist was prepared as in Preparation A except that the water soluble monomer highly ethoxylated TMPTA (Sartomer SR-9035) with a 16 to 1 mole ratio of ethoxy groups to trimethylolpropane was substituted for lightly ethoxylated trimethylolpropane triacrylate (Sartomer SR-454) with a 3 to 1 mole ratio.

Preparation H

Resist formulations were prepared as in A, B and C except that different acrylate and/or methacrylate monomers were used, i.e. diethylene glycol dimethacrylate, pentaerythritol triacrylate, trimethylolpropane triacrylate and pentaerythritol tetraacrylate. In all cases, 0.25 to 0.85 equivalents of ammonia were used to provide partial neutralization of the acrylic latex.

Example 1

Two types of 4"×6" copper-epoxy/glass laminate circuit board samples were: (1) solvent cleaned only, or (2) pumice cleaned and then solvent cleaned.

Preparation A was used to dip coat both (1) and (2) types of boards.

The samples were dried at 70° C. for ten minutes and in both cases a tack free uniform photoresist between 0.5 and 1.0 mil thick was obtained.

A test pattern transparency or phototool was placed in contact with each photoresist and an ultraviolet exposure of 120–150 mJ/cm$^2$ was used to photopolymerize the exposed areas (crosslinking the monomer).

After exposure, the samples were sprayed with a 1% sodium carbonate solution for 30 seconds to dissolve away the unexposed areas. The samples were then rinsed in water and blown dry.

Both types of boards gave excellent adhesion to copper with 1 mil lines with 1 mil photopolymer between these lines.

Comparison circuits prepared with a Shipley Company AZ-119S solvent developed, contact imageable liquid resist formulation did not produce 1 mil lines in practical tests.

Example 2

Comparative Preparation F was coated on copper laminate boards, while Comparative Preparation E was not coatable due to nonhomogeneity. When tested as in Example 1, Preparation F had a tacky surface which made it difficult to remove the test pattern after exposure. This illustrates the need for a Tg above 60° C. if a contact imageable resist is required.

Example 3

Preparation C was dip coated, dried, exposed and developed as in Example 1. Similar 1 mil lines and 1 mil spaces were obtained.

Example 4

Preparations D, G and H were coated and tested as in Example 1. While in no case was it possible to obtain the superior adhesion to copper and 1 mil lines found in Example 1, it was nevertheless possible to produce 6 mil lines which are satisfactory for less demanding circuit or wiring board applications.

Example 5

The boards of Examples 1 and 3 were further tested with exposures as low as 80 mJ/cm$^2$ or development times up to two minutes, while still providing excellent photoresist performance. Boards were further etched in ferric chloride and ammonium persulfate/KOH solution. After etching the photoresist layer was removed by stripping in 5% aqueous NaOH. These tests illustrate that the compositions of the invention exhibit performance latitude and are suitable for the needs of commercial applications.

Example 6

Preparation B was screen printed, dried, exposed, and developed as in Example 1. Similar 1 mil lines and 1 mil spaces were obtained.

We claim:

1. A photoresist coating composition comprising (a) a multifunctional acrylate monomer, (b) a photoinitiator, and (c) a latex of a water insoluble carboxylated acrylate copolymer having an acid number greater than about 80, wherein further the latex has been neutralized with a base in an amount of at least about 0.25 equivalents per equivalent of acid, and wherein (a), (b), and (c) together are a waterborne, stable, homogeneous coating mixture can form a uniform, homogeneous photoresist layer which is aqueous alkali developable and, after crosslinking, is resistant to etch and plating solutions.

2. The coating composition of claim 1 which has a percent solids level of at least about 25%.

3. The coating composition of claim 1 wherein the copolymer of (c) has a glass transition temperature greater than 60° C., the ratio of the amount of polymer:monomer is about 58:42 or greater, and the stable homogeneous coating mixture is a contact imageable photoresist coating composition.

4. The coating composition of claim 1 which also has a photosensitizer.

5. The coating composition of claim 1 wherein the amount of base is in the range of from 0.4 to 0.6 equivalents per equivalent of acid to provide a coating composition that can be applied by screen printing.

6. The coating composition of claim 1 wherein the amount of base is in the range of from 0.3 to 0.5 equivalents per equivalent of acid to provide a coating composition that can be applied by dip-coating.

7. The coating composition of claim 1 wherein the base is ammonia, sodium hydroxide, potassium hydroxide, 4-methylmorpholine, 2-amino-2-methyl-1-propanol, 2-di-methylamino-2-methyl-1-propanol, monoethanol amine, N,N-dimethylethanolamine, methyldiethanol amine, morpholine.

8. The coating composition of claim 1 wherein the photoinitiator is selected from the group consisting of [4-(4-methylphenylthio)phenyl] phenylmethanone, orthochloro HABI, P,P'-bis-dimethylamino benzophenone, benzophenone, 2,2-dimethoxy-2-phenylacetophenone, 1-hydroxycyclohexyl phenyl ketone, isopropylthioxanthone (mixture of 2- and 4-isomers) and 2-methyl-1-[4-(methylthio) phenyl]-2-morpholinopropanone-1.

9. The coating composition of claim 7 wherein the base is ammonia.

10. The coating composition of claim 1 wherein the multifunctional acrylate monomer is water insoluble.

11. A method for preparing a photoresist coating composition which is waterborne, and can form a photoresist layer that is aqueous alkali developable, and is resistant to etch and plating solutions after photopolymerization, the said method comprising the steps of:
(a) adding a base to a latex of a water insoluble carboxylated acrylate copolymer, the said copolymer having an acid number greater than about 80, the base being added in an amount of at least about 0.25 equivalents per equivalent of acid, and
(b) adding a multifunctional acrylate monomer and a photoinitiator to form a stable, homogeneous, waterborne, photoresist coating mixture.

12. The method of claim 11 wherein the water insoluble carboxylated acrylate copolymer has a glass transition temperature greater than 60° C.; wherein further the ratio of the amount of polymer:monomer is about 58:42 or greater, and the stable, homogenous, waterborne photoresist coating mixture formed provides contact imageability.

13. The method of claim 11 wherein the base was added in an amount in the range of from 0.4 to 0.6 equivalents per equivalent of acid.

14. The method of claim 11 wherein the base was added in an amount in the range of from 0.3 to 0.5 equivalents per equivalent of acid.

15. The method of claim 11 wherein the base added was ammonia.

16. The method of claim 11 wherein a photosensitizer is also added.

17. The method of claim 11 wherein before step (b) a monomer pre-mix was formed by mixing the photoinitiator with the monomer while heating, and then as step (b) this monomer pre-mix was added.

18. An aqueous liquid photoresist for dip-coating or spraying comprising in parts by weight:

| | |
|---|---|
| A water insoluble carboxylated acrylic copolymer latex (30-50% solids) | 55-75 parts |
| Water | 25-30 parts |
| 28% aqueous ammonia | 1.0-3.6 parts |
| A multifunctional acrylate monomer | 8-12 parts |
| A water immiscible photoinitiator | 1.5-3 parts |
| A photosensitizer | 0.2-0.8 parts | further providing that the latex has an acid number greater than about 80 and that the aqueous ammonia provides at least about 25% neutralization.

19. An aqueous liquid photoresist for screen printing comprising in parts by weight:

| | |
|---|---|
| A water insoluble carboxylated acrylic copolymer latex (30-50% solids) | 70-85 parts |
| Water | 5-10 parts |
| 28% aqueous ammonia | 1.4-4.0 parts |
| A multifunctional acrylate monomer | 10-15 parts |
| A water immiscible photoinitiator | 1.5-3 parts |
| A photosensitizer | 0.2-0.8 parts | further providing that the latex has an acid number greater than about 80 and that the aqueous ammonia provides at least about 25% neutralization.

20. A method for producing patterns on a substrate comprising the steps:
(a) applying to a metal substrate a water-borne photoresist coating composition of a water insoluble carboxylated acrylate copolymer latex, the said copolymer having a glass transition temperature greater than 60° C. and an acid number greater than about 80 which further is neutralized with a base in an amount of at least about 0.25 equivalents per equivalent of acid, a multifunctional acrylate monomer and a photoinitiator;
(b) drying the composition to produce a 0.2 to 2.0 mil contact imageable photoresist film;
(c) imaging the photoresist film; and
(d) developing the film with a mild alkaline solution.

* * * * *

UNITED STATES PATENT AND TRADEMARK OFFICE
CERTIFICATE OF CORRECTION

PATENT NO.   :   5,045,435
DATED        :   September 3, 1991
INVENTOR(S)  :   Diane L. Adams et al It is certified that error appears in the above-identified patent and that said Letters Patent is hereby corrected as shown below:

On the cover page, at Inventors:, "Donald Jones" should read --Donald B. Jones--.

In the Claims, claim 1 at column 10, line 31, the word --and-- should be inserted after "mixture"; claim 7 at column 10, line 58, the word --or-- should be inserted after "amine,".

Signed and Sealed this

Tenth Day of November, 1992

Attest:

DOUGLAS B. COMER

Attesting Officer    Acting Commissioner of Patents and Trademarks